US005774408A

United States Patent [19]

Shirley

[11] Patent Number: 5,774,408
[45] Date of Patent: Jun. 30, 1998

[54] DRAM ARCHITECTURE WITH COMBINED SENSE AMPLIFIER PITCH

[75] Inventor: Brian M. Shirley, Boise, Id.

[73] Assignee: Micron Technology, Inc., Boise, Id.

[21] Appl. No.: 790,375

[22] Filed: Jan. 28, 1997

[51] Int. Cl.$^6$ .................................. G11C 8/00; G11C 7/02
[52] U.S. Cl. ..................... 365/230.03; 365/207; 365/208
[58] Field of Search ......................... 365/230.03, 189.01, 365/207, 208, 149

[56] References Cited

U.S. PATENT DOCUMENTS

| | | | |
|---|---|---|---|
| 5,015,883 | 5/1991 | Waller | 365/189.08 |
| 5,042,011 | 8/1991 | Casper et al. | 365/205 |
| 5,220,215 | 6/1993 | Douglas et al. | 320/39 |
| 5,220,221 | 6/1993 | Casper | 327/51 |
| 5,235,221 | 8/1993 | Douglas et al. | 326/38 |
| 5,235,550 | 8/1993 | Zagar | 365/226 |
| 5,245,578 | 9/1993 | McLaury | 365/203 |
| 5,280,205 | 1/1994 | Green et al. | 327/51 |
| 5,287,017 | 2/1994 | Narasimhan et al. | 326/37 |
| 5,298,803 | 3/1994 | Starkweather | 326/37 |
| 5,300,830 | 4/1994 | Hawes | 326/41 |
| 5,302,870 | 4/1994 | Chern | 327/51 |
| 5,305,263 | 4/1994 | Morgan | 365/120 |
| 5,311,478 | 5/1994 | Zagar et al. | 365/189.01 |
| 5,367,213 | 11/1994 | Casper | 327/56 |
| 5,490,112 | 2/1996 | Hush et al. | 365/189.04 |
| 5,506,811 | 4/1996 | McLaury | 365/233 |
| 5,657,266 | 8/1997 | McLaury | 365/149 |

*Primary Examiner*—David C. Nelms
*Assistant Examiner*—Trong Phan
*Attorney, Agent, or Firm*—Schwegman, Lundberg, Woessner & Kluth, P.A.

[57] ABSTRACT

A memory architecture, suitable for a dynamic random access memory (DRAM) reduces layout area by sharing sense amplifiers, and arranging sense amplifiers to minimize die area. The sense amplifiers, comprising N-sense and P-sense amplifiers, are laid out in a region between memory array portions having memory cells that are each coupled to a digit line in a plurality of alternatingly sequenced digit line pairs. Each region has one N-sense amplifier for every two digit line pairs, and one P-sense amplifier for each digit line pair. Each N-sense amplifier is shared between two memory array portions, and is separated from each by an NFET isolation switch. Each P-sense amplifier is neither shared between the two memory array portions, nor separated from its corresponding memory array portion by an NFET isolation switch.

15 Claims, 4 Drawing Sheets

DRAM ARCHITECTURE WITH COMBINED SENSE AMPLIFIER PITCH

FIELD OF THE INVENTION

This invention relates to an integrated circuit memory, and more particularly to an architecture and physical floorplan of a dynamic random access memory (DRAM).

BACKGROUND

Semiconductor memory manufacturing technology allows the creation of high density memories on an integrated circuit chip. Such memories consist of many memory cells in one or more arrays, each cell capable of storing one data bit.

A dynamic random access memory (DRAM) includes an arrangement of such memory cells. Each memory cell comprises a storage capacitor for storing a data bit as a charge and an access transistor for accessing the charge. The data bit charge provides either a binary logic high (high) voltage or a binary logic low (low) voltage. Data is stored in the memory cells during a write mode and retrieved during a read mode. The data is transmitted to and from the memory cells on signal lines, referred to as bit lines or digit lines. The digit lines are coupled to input/output (I/O) lines through I/O transistors used as switches. Each memory cell provides, through a true digit line, the logic state of its stored data bit to a corresponding I/O line. Each memory cell also provides, through a corresponding complementary digit line, the complementary logic state of its stored data bit to a corresponding I/O complement line. The true digit line and corresponding complementary digit lines are referred to collectively as a digit line pairs.

The memory cells are typically organized as one or more arrays and each memory cell has an address identifying its location in its array. The array organization comprises a configuration of intersecting rows and columns. A memory cell is associated with each intersection. In order to read from or write to a memory cell, that memory cell must be selected, or addressed. A row decoder activates a word line in response to a specified row address. The activated word line turns on the access transistors for each memory cell of the row. A column decoder selects a digit line pair in response to a specified column address. For a read operation the selected word line activates the access transistors for all memory cells in the row, and the column decoder couples the data of a particular memory cell onto a corresponding digit line pair.

As set forth above, DRAM memory cells use storage capacitors to store data. A logical high, or logical "1", is stored as a charge on the capacitor. The capacitor is discharged for a logical low, or logical "0". Digit line pairs are fabricated as metal lines on the integrated circuit and connected to the memory cells for communicating data stored in the memory cells.

For reading data, the digit line pairs are first equilibrated to the same voltage. Charge from a particular memory cell is coupled, for example, onto a true digit line, resulting in a small differential voltage between the true digit line and its corresponding complementary digit line. A sense amplifier senses the small differential voltage across the digit line pair, and further increases the voltage differential to full logic levels for communication to the corresponding I/O lines.

Physical layout of the DRAM typically comprises an architecture that includes a particular arrangement of arrays of memory cells, sense amplifiers for accessing the memory cells therein, and other DRAM constituent elements. Proper operation of the DRAM requires strict adherence to certain minimum spacing requirements between different DRAM constituent elements. There is a need in the art to provide a densely packed DRAM architecture that increases memory capacity while meeting minimum spacing requirements for proper operation.

SUMMARY

The present invention provides an integrated circuit memory that minimizes chip area and further avoids the use of complex voltage boosting circuits. The memory includes a block having first and second memory array portions, each having a plurality of digit line pairs. A first plurality of first type sense amplifiers is interposed between the first and second memory array portions. In the first plurality of first type sense amplifiers, there is one first type sense amplifier for every two digit line pairs in each of the first and second memory array portions. A second plurality of second type sense amplifiers is interposed between the first and second memory array portions, of which there is one second type sense amplifier for each digit line pair in the second memory array portion.

In one embodiment, a third plurality of second type sense amplifiers is located peripheral to the first and second memory array portions. In the third plurality of second type sense amplifiers, there is one second type sense amplifier for each digit line pair in the first memory array portion. A fourth plurality of first type sense amplifiers is located peripheral to the first and second memory array portions. In the fourth plurality of first type sense amplifiers, there is one first type sense amplifier for every two digit line pairs in the first memory array portion. A fifth plurality of first type sense amplifiers is located peripheral to the first and second memory array portions. In the fifth plurality of first type sense amplifiers, there is one first type sense amplifier for every two digit line pairs in the second memory array portion.

In one embodiment, the first type sense amplifiers are N-sense amplifiers, and the second type sense amplifiers are P-sense amplifiers. In another embodiment, the first type sense amplifiers are P-sense amplifiers, and the second type sense amplifiers are N-sense amplifiers.

Multiple instances of the above-described block are arranged to allow sharing of the fourth and fifth pluralities of sense amplifiers between blocks. The DRAM architecture according to the present invention avoids the need for a boosted gate voltage for controlling isolation switches. The number of p-well to n-well spacings is minimized, thereby saving space. Thus, the present invention provides an integrated circuit memory that increases memory capacity while meeting minimum spacing requirements for proper operation.

DETAILED DESCRIPTION

In the following detailed description, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
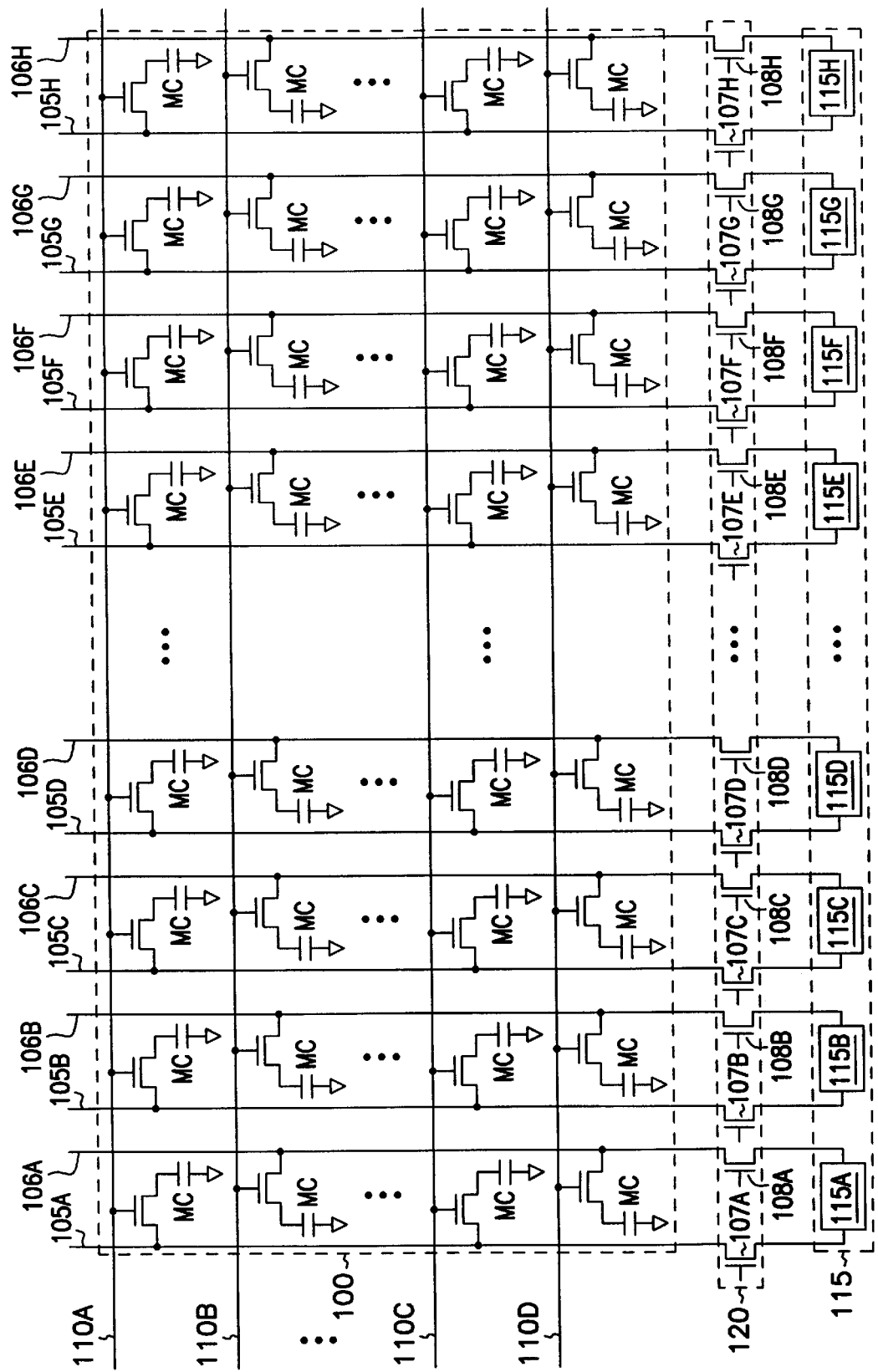
FIG. 1 is a schematic illustration of one portion of a conventional dynamic random access memory (DRAM).

FIG. 1 illustrates generally one embodiment of the organization of a portion of a conventional dynamic random access memory (DRAM). Organization of a memory cell array 100 is illustrated generally, comprising individual memory cells that are each designated as MC. Each memory cell is comprised of a memory cell storage capacitor and a cell access field effect transistor (FET).

In FIG. 1, the gate terminals of the cell access FETs are each coupled to one of word lines 110A–D, generally designated at 110. Word lines 110 are controlled by a row decoder that activates a particular word line determined by a row address. The storage capacitor stores binary data as a quantity of charge. The cell access FETs act as switches to transfer charge between the storage capacitors and their respective digit lines 105, 106. Each memory cell is coupled to either a true digit line 105A–H or a complementary digit line 106A–H. The true and complementary digit lines are referred to generally as digit lines 105, 106, and each digit line 105, 106 has a corresponding true or complementary isolation FET 107A–H, 108A–H for isolating the memory cell array 100 from other DRAM circuits.

In FIG. 1, the cell access FET acts as a switch having two states. The particular state of the cell access FET is determined by a control voltage at a gate terminal of the cell access FET. In one state, the cell access FET electrically couples the memory cell storage capacitor to a digit line 105, 106. In the other state, the cell access FET electrically isolates the memory cell storage capacitor from the digit line 105, 106. In FIG. 1, dotted lines indicate generally other instantiations of memory cells and digit lines which are not illustrated in FIG. 1.

In reading data from a particular memory cell, a voltage difference is sensed and amplified by one of sense amplifiers 115A–H, collectively 115, between a true digit line 105 to which the particular memory cell is coupled and a corresponding complementary digit line 106. The voltage difference between true digit line 105 and complementary digit line 106 results from coupling charge from a memory cell through its corresponding memory cell access transistor to one of true digit line 105 and complementary digit line 106. In reading data from a memory cell coupled to true digit line 105A, for example, isolation FETs 107A and 107B are turned on. Through isolation FETs 107A and 107B, sense amplifier 115A then senses and amplifies a voltage difference between true digit line 105A and corresponding complementary digit line 106A.

Figure 2:
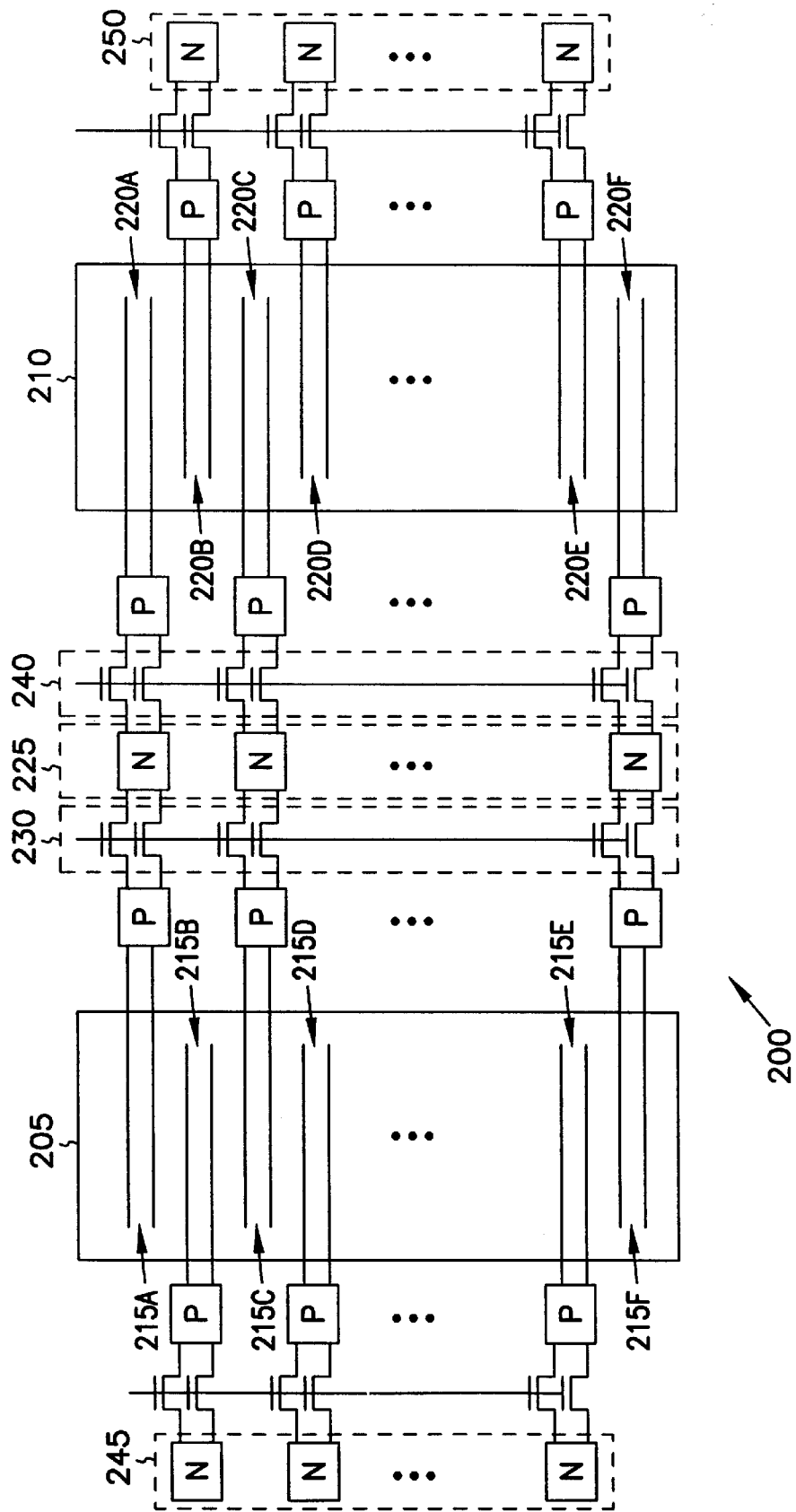
FIG. 2 is a floorplan diagram of a first embodiment of a portion of a conventional DRAM.

FIG. 2 illustrates generally a conventional floorplan diagram of a block 200 portion of a DRAM, which typically includes multiple instances of block 200. Block 200 includes first and second memory cell array portions 205 and 210, each having a plurality of memory cells, and each memory cell coupled to one digit line in a sequence of digit line pairs. Interdigitation of the sequenced digit line pairs 215A–F in first array portion 205 sequentially allows alternating access to a particular digit line pair, either between first array portion 205 and second array portion 210 or proximal to first array portion 205 but distal to second array portion 210. Similarly, interdigitation of the sequenced digit line pairs 220A–F in second array portion 210 sequentially allows alternating access to a particular digit line pair, either between first array portion 205 and second array portion 210 or proximal to second array portion 210 but distal to first array portion 205.

Each digit line pair has a corresponding sense amplifier that includes an N-sense amplifier and a P-sense amplifier. As described above, a small voltage differential is created between the true and complementary digit lines in the digit line pair when reading a memory cell. The N-sense amplifier comprises n-channel field-effect transistors (NFETs) for further decreasing the more negative voltage of the digit line pair. The P-sense amplifier comprises p-channel field-effect transistors (PFETs) for further increasing the more positive voltage of the digit line pair.

Sense amplifiers can also be shared between first array portion 205 and second array portion 210, provided they are not simultaneously used for both first and second array portions 205 and 210, respectively. For example, interior N-sense amplifiers 225 are used for both of the first and second array portions 205 and 210, respectively. When N-sense amplifiers 225 are used for first array portion 225, first isolation switches 230 turned on, and second isolation switches 240 are turned off. In this state, N-sense amplifiers 225 are coupled to digit line pairs in first array portion 205, but isolated from digit line pairs in second array portion 210. Similarly, first isolation switches 230 can be turned off, and second isolation switches 240 turned on to couple N-sense amplifiers 225 to digit line pairs in second array portion 210 and isolate N-sense amplifiers 225 from digit line pairs in first array portion 205.

It is understood from FIG. 2, that multiple instances of block 200 could be linearly arranged in a row. Duplication of peripheral N-sense amplifiers 245 and 250 with corresponding peripheral N-sense amplifiers in adjacent instances of block 200 could be eliminated by overlapping adjacent blocks 200, i.e. sharing N-sense amplifiers between adjacent instances of block 200, as described above.

A disadvantage of the DRAM architecture illustrated in FIG. 2, is the wasted space between P-sense amplifiers and adjacent N-sense amplifiers 225 and NFET isolation switches 230. In a twin-well process, i.e. a process forming NFET's in p-type well areas and PFETs in n-type well areas, a substantial spacing is required between n-well and p-well areas to ensure proper circuit operation. This imposes a significant separation requirement between P-sense amplifiers and N-sense amplifiers 225, which reduces the density of the DRAM layout.

Figure 3:
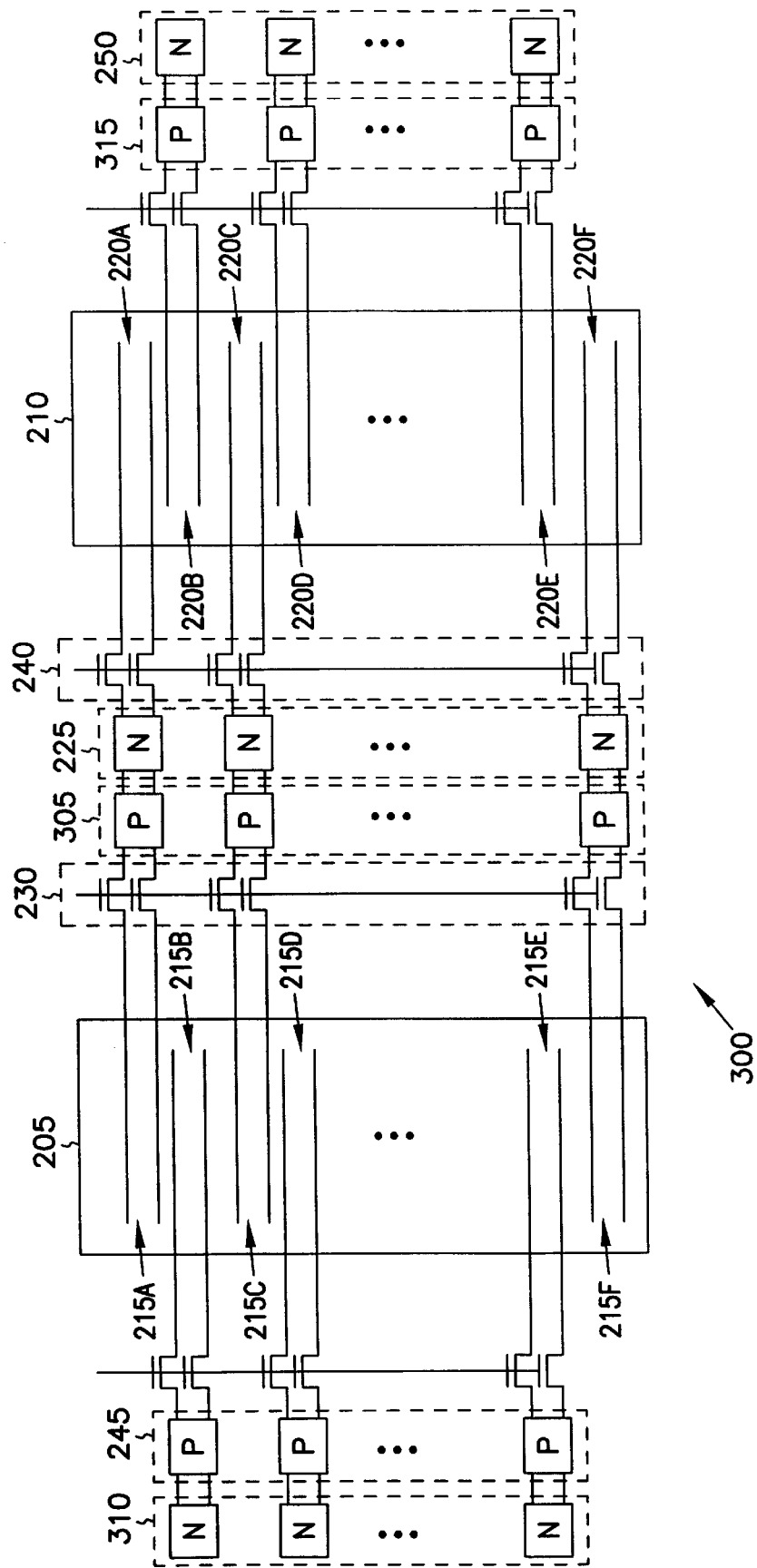
FIG. 3 is a floorplan diagram of a second embodiment of a portion of a conventional DRAM.

FIG. 3 illustrates generally a conventional floorplan diagram of a block 300 portion of a DRAM, which typically includes multiple instances of block 300. FIG. 3 illustrates a reconfiguration of block 200 in FIG. 2 that allows sharing of both P-sense amplifiers and N-sense amplifiers between first array portion 205 and second array portion 210. In FIG. 3, P-sense amplifiers 305 and adjacent interior sense amplifiers 225 are together isolated from first array portion 205 by first isolation switches 230, and are together isolated from second array portion 210 by second isolation switches 240.

When P-sense amplifiers 305 and N-sense amplifiers 225 are used together for first array portion 225, first isolation switches 230 turned on, and second isolation switches 240 are turned off. In this state, P-sense amplifiers 305 and N-sense amplifiers 225 are coupled to digit line pairs in first array portion 205, but isolated from digit line pairs in second array portion 210. Similarly, first isolation switches 230 can be turned off, and second isolation switches 240 turned on to couple P-sense amplifiers 305 and N-sense amplifiers 225 to digit line pairs in second array portion 210 and isolate P-sense amplifiers 305 and N-sense amplifiers 225 from digit line pairs in first array portion 205.

It is understood from FIG. 3, that multiple instances of block 300 could be linearly arranged in a row. Duplication of peripheral P-sense amplifiers 310 and 315 and peripheral N-sense amplifiers 245 and 250 with corresponding peripheral P-sense amplifiers and N-sense amplifiers in adjacent instances of block 300 could be eliminated by overlapping adjacent blocks 300, i.e. sharing P-sense amplifiers and N-sense amplifiers between adjacent instances of block 200, as described above.

As described above, a DRAM architecture comprising multiple instances of block 300 can advantageously share adjacent P-sense and N-sense amplifiers between memory arrays on both sides of the sense amplifiers. However, block 300 typically requires generation of a boosted gate voltage to control isolation switches 230 and 240, as explained below.

As seen in FIG. 3, each of P-sense amplifiers 305 is separated from each of its corresponding digit lines in each of respective first and second array portions 205 and 210 by one of isolation switches 230 and 240. Isolation switches 230 and 240 are typically implemented as NFETs, each of which typically requires a control voltage at a gate terminal that exceeds the maximum voltage to be conducted through the switch by a threshold voltage ($V_t$).

As described above, each P-sense amplifier further increases the voltage of the more positive digit line during reading. For example, for one of P-sense amplifiers 305 to charge a corresponding digit line to the positive supply voltage ($V_{cc}$), the control gate voltage of the corresponding NFET isolation switch must be boosted to $V_{cc}+V_t$. A boosted voltage that exceeds $V_{cc}$ typically requires complicated voltage pumps for generating the boosted voltage, and complicated level-shifting and analog driver circuits for providing the control gate signal of the NFET isolation switch.

Figure 4:
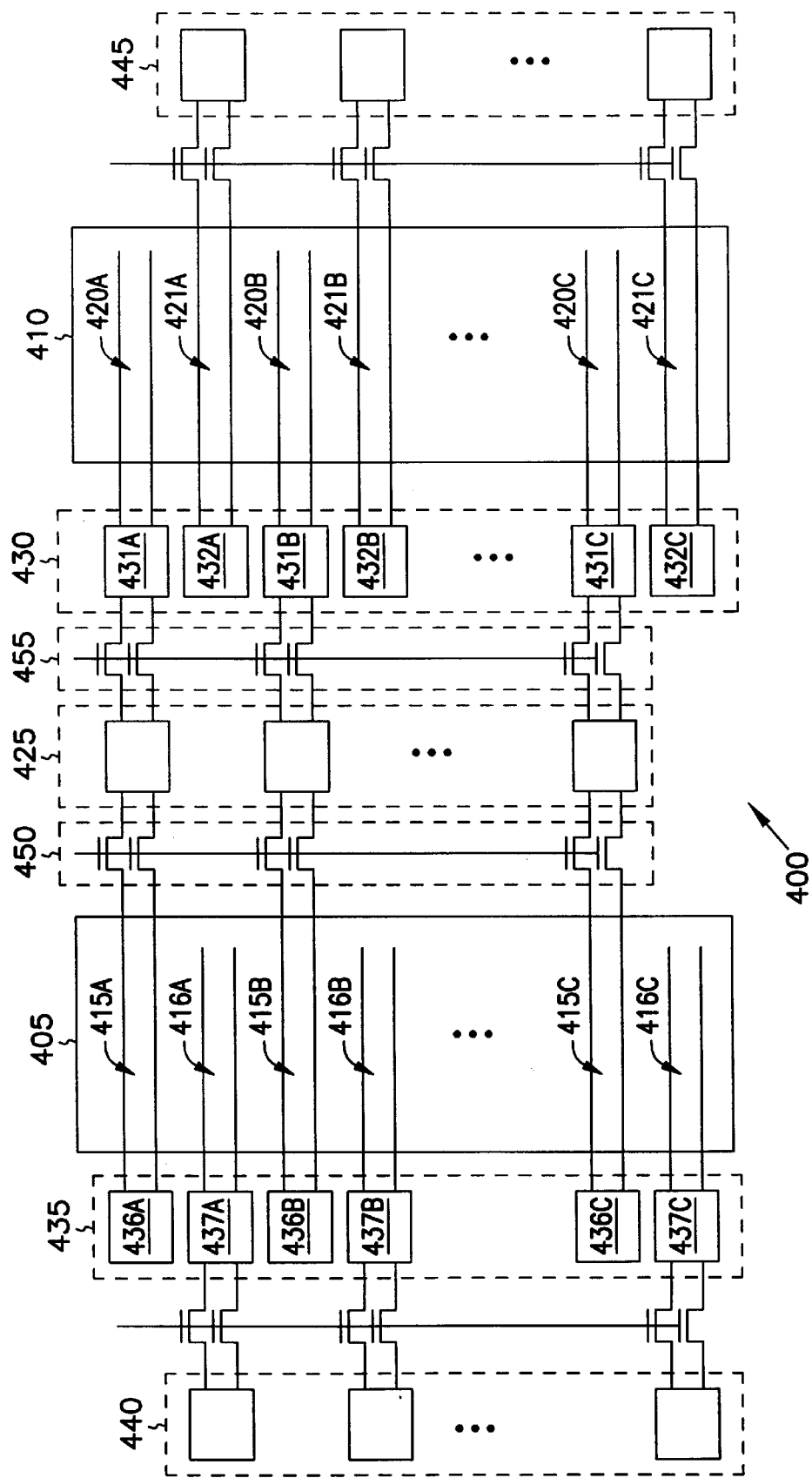
FIG. 4 is a floorplan diagram of one embodiment of a portion of a DRAM architecture according to the present invention.

FIG. 4 illustrates generally a floorplan diagram of a block 400 portion of a DRAM architecture according to the present invention, in which the DRAM architecture typically includes multiple instances of block 400, as explained below. Block 400 includes respective first and second memory cell array portions 405 and 410, each having a plurality of memory cells, and each memory cell coupled to one digit line in a sequenced plurality of digit line pairs.

A sequenced plurality of digit line pairs in first array portion 405 includes a first group of digit line pairs 415A–C and a second group of digit line pairs 416A–C, referred to generally as 415 and 416, respectively. Each of the first and second groups of digit line pairs 415 and 416 is interdigitated with the other, i.e. alternatingly sequentially arranged. The first group of digit line pairs 415 is accessible from between respective first and second array portions 405 and 410, and also accessible along a periphery of first array portion 405 that is distal from second array portion 410. The second group of digit line pairs 416 is accessible along the periphery of first array portion 405 that is distal from second array portion 410, but is typically not accessible from between respective first and second array portions 405 and 410.

A sequenced plurality of digit line pairs in second array portion 410 includes a first group of digit line pairs 420A–C, referred to generally as 420, and a second group of digit line pairs 421A–C, referred to generally as 421. Each of the first and second groups of digit line pairs 420 and 421 is interdigitated with the other, i.e. alternatingly sequentially arranged. The first group of digit line pairs 420 is accessible from between respective first and second array portions 405 and 410, but is typically not accessible from along the periphery of second array portion 410 that is distal from first array portion 405. The second group of digit line pairs 421 is accessible both along the periphery of second array portion 410 that is distal from first array portion 405, and from between respective first and second array portions 405 and 410.

It is understood that the sequenced plurality of digit lines in each of the respective first and second array portions 405 and 410 may include other similarly interdigitated digit line pairs that are not shown. Each such digit line pair has a corresponding sense amplifier that includes an N-sense amplifier and a P-sense amplifier, as described below.

Block 400 includes a first plurality 425 of sense amplifiers of a first type, such as N-sense amplifiers comprising NFETs. The first plurality 425 of sense amplifiers is interposed between respective first and second array portions 405 and 410. In the first plurality 425 of sense amplifiers, there is one sense amplifier for every two digit line pairs in each of the respective first and second memory array portions 405 and 410. More particularly, each one of the first plurality 425 of sense amplifiers is electrically coupled to one of respective first groups 415 and 420 of digit line pairs in each of the respective first and second array portions 405 and 410.

A second plurality 430 of sense amplifiers of a second type, such as P-sense amplifiers comprising PFETs, is also interposed between respective first and second array portions 405 and 410. The second plurality 430 of sense amplifiers is typically interposed between the first plurality 425 of sense amplifiers and the second array portion 410. In the second plurality 430 of sense amplifiers, there is one sense amplifier for each digit line pair in the second array portion 410. More particularly, the second plurality 430 of sense amplifiers includes respective first and second groups 431A–C and 432A–C of sense amplifiers, referred to generally as 431 and 432 respectively. Each one of the first group 431 of the second plurality 430 of sense amplifiers is electrically coupled to one of the first group 420 of digit line pairs in the second array portion 410. Each one of the second group 432 of the second plurality 430 of sense amplifiers is electrically coupled to one of the second group 421 of digit line pairs in the second array portion 410.

A third plurality 435 of sense amplifiers of a second type, such as P-sense amplifiers, is located peripheral to the respective first and second array portions 405 and 410. Third plurality 435 of sense amplifiers is proximal to first array portion 405 and distal to second array portion 410. In the third plurality 435 of sense amplifiers, there is one sense amplifier for each digit line pair in the first array portion 405. More particularly, the third plurality 435 of sense amplifiers includes respective first and second groups 436A–C and 437A–C of sense amplifiers, referred to generally as 436 and 437, respectively. Each one of the first group 436 of the third plurality 435 of sense amplifiers is electrically coupled to one of the first group 415 of digit line pairs in the first array portion 405. Each one of the second group 437 of the third plurality 435 of sense amplifiers is electrically coupled to one of the second group 416 of digit line pairs in the first array portion 405.

A fourth plurality 440 of sense amplifiers of a first type, such as N-sense amplifiers, is located peripheral to the respective first and second array portions 405 and 410. The fourth plurality 440 of sense amplifiers is proximal to first array portion 405 and distal to second array portion 410. The third plurality 435 of sense amplifiers is interposed between fourth plurality 440 of sense amplifiers and first array portion 405. In the fourth plurality 440 of sense amplifiers, there is one sense amplifier for every two digit line pairs in the first array portion 405. More particularly, each one of the fourth plurality 440 of sense amplifiers is electrically coupled to one of second group 416 of digit line pairs in first array portion 405.

A fifth plurality 445 of sense amplifiers of a first type, such as N-sense amplifiers, is located peripheral to the respective first and second array portions 405 and 410. The fifth plurality 445 of sense amplifiers is proximal to second array portion 410 and distal to first array portion 405. In the fifth plurality 445 of sense amplifiers, there is one sense amplifier for every two digit line pairs in the second array portion 410. More particularly, each one of the fifth plurality 445 of sense amplifiers is electrically coupled to one of second group 421 of digit line pairs in second array portion 410.

Each one of the first plurality 425 of sense amplifiers is shared between first array portion 405 and second array portion 410, and are not simultaneously used for both first and second array portions 405 and 410, respectively. When the first plurality 425 of sense amplifiers are used for first array portion 405, first isolation switches 450 are turned on, and second isolation switches 455 are turned off. In this state, ones of the first plurality 425 of sense amplifiers are electrically coupled to corresponding ones of first group 415 of digit line pairs in first array portion 405, but are isolated from corresponding ones of first group 420 of digit line pairs in second array portion 410. Similarly, first isolation switches 450 are turned off, and second isolation switches 455 turned on to couple ones of the first plurality 425 of amplifiers to corresponding ones of digit line pairs in second array portion 410, and isolate ones of the first plurality 425 of sense amplifiers from corresponding ones of digit line pairs in first array portion 405.

The DRAM architecture of the present invention avoids interposing an isolation switch between sense amplifiers of the second type, such as in second plurality 430 and third plurality 435 of sense amplifiers, and corresponding respective second and first array portions 410 and 405. In the case where the second type of sense amplifiers are P-sense amplifiers and the isolation switches are NFETs, the present invention avoids the need for using a boosted control gate voltage and the above-described complications associated therewith.

Also, first and second isolation switches 450 and 455, respectively, are typically placed in the same well as the first plurality 425 of sense amplifiers, thereby saving space. For example, if first plurality 425 of sense amplifiers comprises N-sense amplifiers, which include NFETs placed in a p-well, and first and second isolation switches 450 and 455 are NFETs placed in a p-well, then these p-wells can be implemented as a shared p-well, i.e. a single p-well that is shared between the first plurality 425 of sense amplifiers and the first and second isolation switches 450 and 455. This reduces the number of p-well to n-well spacings, which must typically be quite large in order to ensure proper operation, as described above. For example, the region between first and second memory array portions 205 and 210, respectively, in each of FIGS. 2–3 includes two p-well to n-well spacings, but the region between first and second memory array portions 405 and 410, respectively, in FIG. 4 includes only one p-well to n-well spacing. The space saving afforded by the present invention increases DRAM circuit density.

It is understood from FIG. 4, that multiple instances of block 400 are typically linearly arranged in a row. Duplication of the fourth plurality 440 and the fifth plurality 445 of sense amplifiers is eliminated by overlapping adjacent blocks 400, i.e. sharing the sense amplifiers of the fourth plurality 440 and the fifth plurality 445 between adjacent instances of block 400, as described above.

In such an arrangement of blocks 400, fourth plurality 440 of sense amplifiers is shared between the second group 416 of digit line pairs in first array portion 405 and a second group of digit line pairs in a second array portion of an adjacent instance of block 400, not shown. Fifth plurality 445 of sense amplifiers is shared between the second group 421 of digit line pairs in second array portion 410 and a second group of digit line pairs in a first array portion of another adjacent instance of block 400, not shown. Use of isolation switches to implement this sharing of sense amplifiers is analogous to that described above with respect to first plurality 425 of sense amplifiers.

It is also possible, for example, to implement the first, fourth, and fifth pluralities of sense amplifiers of a first type as P-sense amplifiers, and the second and third pluralities of sense amplifiers of a second type as N-sense amplifiers, and the first and second isolation switches 450 and 455 as PFETs. In such an alternate embodiment, those sense amplifiers that are separated from their corresponding digit line pairs by isolation switches comprise switches of the same conductivity type as their corresponding isolation switches. This allows the isolation switches to conduct the full voltage provided by these sense amplifiers.

Thus, the present invention provides a densely packed DRAM architecture that increases memory capacity while meeting minimum spacing requirements for proper operation. It should be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. An integrated circuit memory, comprising:
   first and second memory array portions, each having a plurality of digit line pairs;
   a first plurality of first type sense amplifiers, interposed between the first and second memory array portions, of which there is one first type sense amplifier for every two digit line pairs in each of the first and second memory array portions; and
   a second plurality of second type sense amplifiers, interposed between the first and second memory array portions, of which there is one second type sense amplifier for each digit line pair in the second memory array portion.

2. The integrated circuit memory of claim 1, further comprising a third plurality of second type sense amplifiers, peripheral to the first and second memory array portions, of which there is one second type sense amplifier for each digit line pair in the first memory array portion.

3. The integrated circuit memory of claim 1, further comprising a fourth plurality of first type sense amplifiers, peripheral to the first and second memory array portions, of which there is one first type sense amplifier for every two digit line pairs in the first memory array portion.

4. The integrated circuit memory of claim 1, further comprising a fifth plurality of first type sense amplifiers, peripheral to the first and second memory array portions, of which there is one first type sense amplifier for every two digit line pairs in the second memory array portion.

5. The integrated circuit memory of claim 1, wherein the first type sense amplifiers are N-sense amplifiers, and the second type sense amplifiers are P-sense amplifiers.

6. The integrated circuit memory of claim 1, wherein the first type sense amplifiers are P-sense amplifiers, and the second type sense amplifiers are N-sense amplifiers.

7. An integrated circuit memory, comprising:
   first and second memory array portions, each having a plurality of digit line pairs;
   a first plurality of first type sense amplifiers, interposed between the first and second memory array portions, of which there is one first type sense amplifier electrically coupled to one of every two digit line pairs in each of the first and second memory array portions;
   a second plurality of second type sense amplifiers, interposed between the first and second memory array portions, of which there is one second type sense amplifier electrically coupled to each digit line pair in the second memory array portion;
   a third plurality of first type sense amplifiers, peripheral to the first and second memory array portions, of which there is one first type sense amplifier electrically coupled to each digit line pair in the first memory array portion;
   a fourth plurality of first type sense amplifiers, peripheral to the first and second memory array portions, of which there is one first type sense amplifier electrically coupled to one of every two digit line pairs in the first memory array portion; and
   a fifth plurality of first type sense amplifiers, peripheral to the first and second memory array portions, of which there is one first type sense amplifier electrically coupled to one of every two digit line pairs in the second memory array portion.

8. The integrated circuit memory of claim 7, wherein the first type sense amplifiers are N-sense amplifiers, and the second type sense amplifiers are P-sense amplifiers.

9. The integrated circuit memory of claim 7, wherein the first type sense amplifiers are P-sense amplifiers, and the second type sense amplifiers are N-sense amplifiers.

10. An integrated circuit memory, comprising:
    first and second memory array portions, each having a plurality of sequenced digit line pairs including alternating first and second groups of digit line pairs;
    a first plurality of sequenced first type sense amplifiers, interposed between the first and second memory array portions, of which each of the first type sense amplifiers is electrically coupled to one of the first group of digit line pairs in each of the first and second memory array portions;
    a second plurality of sequenced second type sense amplifiers, interposed between the first and second memory array portions, including a first group of second type sense amplifiers, each of which is electrically coupled to one of the first plurality of sequenced first type sense amplifiers, and also electrically coupled to one of the first group of digit line pairs in the second memory array portion; and
    a third plurality of sequenced second type sense amplifiers, proximal to the first memory array portion and distal to the second memory array portion, including a first group of second type sense amplifiers, each of which is electrically coupled to one of the first plurality of sequenced first type sense amplifiers and also electrically coupled to one of the first group of digit line pairs in the first memory array portion.

11. The memory of claim 10, wherein the second plurality of sequenced second type sense amplifiers includes a second group of second type sense amplifiers, each of which is coupled to one of the second group of digit line pairs in the second memory array portion that are not electrically coupled to one of the first plurality of sequenced first type sense amplifiers.

12. The memory of claim 11, wherein the third plurality of sequenced second type sense amplifiers includes a second group of second type sense amplifiers, each of which is coupled to one of the second group of digit line pairs in the first memory array portion that are not electrically coupled to one of the first plurality of sequenced first type sense amplifiers.

13. The memory of claim 12, further comprising:
    a fourth plurality of sequenced first type sense amplifiers, proximal to the first memory array portion and distal to the second memory array portion, wherein each one of the fourth plurality of sequenced first type sense amplifiers is electrically coupled to one of the second group of digit line pairs in the first memory array portion; and
    a fifth plurality of sequenced first type sense amplifiers, proximal to the second memory array portion and distal to the first memory array portion, wherein each one of the fifth plurality of sequenced first type sense amplifiers is electrically coupled to one of the second group of digit line pairs in the second memory array portion.

14. The integrated circuit memory of claim 13, wherein the first type sense amplifiers are N-sense amplifiers and the second type sense amplifiers are P-sense amplifiers.

15. The integrated circuit memory of claim 13, wherein the first type sense amplifiers are P-sense amplifiers and the second type sense amplifiers are N-sense amplifiers.

* * * * *